United States Patent [19]
Shinbara

[11] Patent Number: 6,155,275
[45] Date of Patent: Dec. 5, 2000

[54] SUBSTRATE PROCESSING UNIT AND SUBSTRATE PROCESSING APPARATUS USING THE SAME

[75] Inventor: Kaoru Shinbara, Shiga-ken, Japan

[73] Assignee: Dainippon Screen Mfg. Co., Ltd., Japan

[21] Appl. No.: 09/149,772

[22] Filed: Sep. 8, 1998

[30] Foreign Application Priority Data

Sep. 11, 1997 [JP] Japan ................................. 9-247217

[51] Int. Cl.⁷ .................................................. B08B 3/02
[52] U.S. Cl. ........................... 134/61; 134/147; 134/186; 134/902
[58] Field of Search ............................. 134/32, 25.4, 61, 134/186, 902, 200, 147

[56] References Cited

U.S. PATENT DOCUMENTS

| | | | |
|---|---|---|---|
| 4,345,615 | 8/1982 | Dicicco et al. | 134/902 |
| 4,506,687 | 3/1985 | Rosch, III | 134/902 |
| 5,247,953 | 9/1993 | D'Amato | 134/186 |
| 5,313,965 | 5/1994 | Palen | 134/902 |
| 5,485,644 | 1/1996 | Shinbara et al. | 134/902 |
| 5,530,222 | 6/1996 | Peck et al. | |
| 5,868,865 | 2/1999 | Akimoto | |
| 5,975,097 | 11/1999 | Yonemizy et al. | 134/147 |

FOREIGN PATENT DOCUMENTS

| | | | |
|---|---|---|---|
| 60-154519 | 8/1985 | Japan | 134/61 |
| 3-283429 | 12/1991 | Japan | 134/902 |
| 6-55114 | 3/1994 | Japan | 134/102.1 |

*Primary Examiner*—Frankie L. Stinson
*Attorney, Agent, or Firm*—Ostrolenk, Faber, Gerb & Soffen, LLP

[57] ABSTRACT

A substrate processing unit having a substrate processing section for processing a substrate held therein while supplying a process fluid to the substrate; an enclosure enclosing the substrate processing section and having an opening, formed in a side wall thereof, through which the substrate is carried in and out of the substrate processing section; a process fluid pipe through which the process fluid is supplied to the substrate held in the processing section; and a connector section for connecting the process fluid pipe to an external process fluid source. The connector section is provided on a side wall of the enclosure opposite across the substrate processing section from the side wall formed with the opening. A substrate processing apparatus is constituted by a plurality of such substrate processing units which are arranged with the openings thereof being oriented in substantially the same direction.

8 Claims, 14 Drawing Sheets

F I G. 7
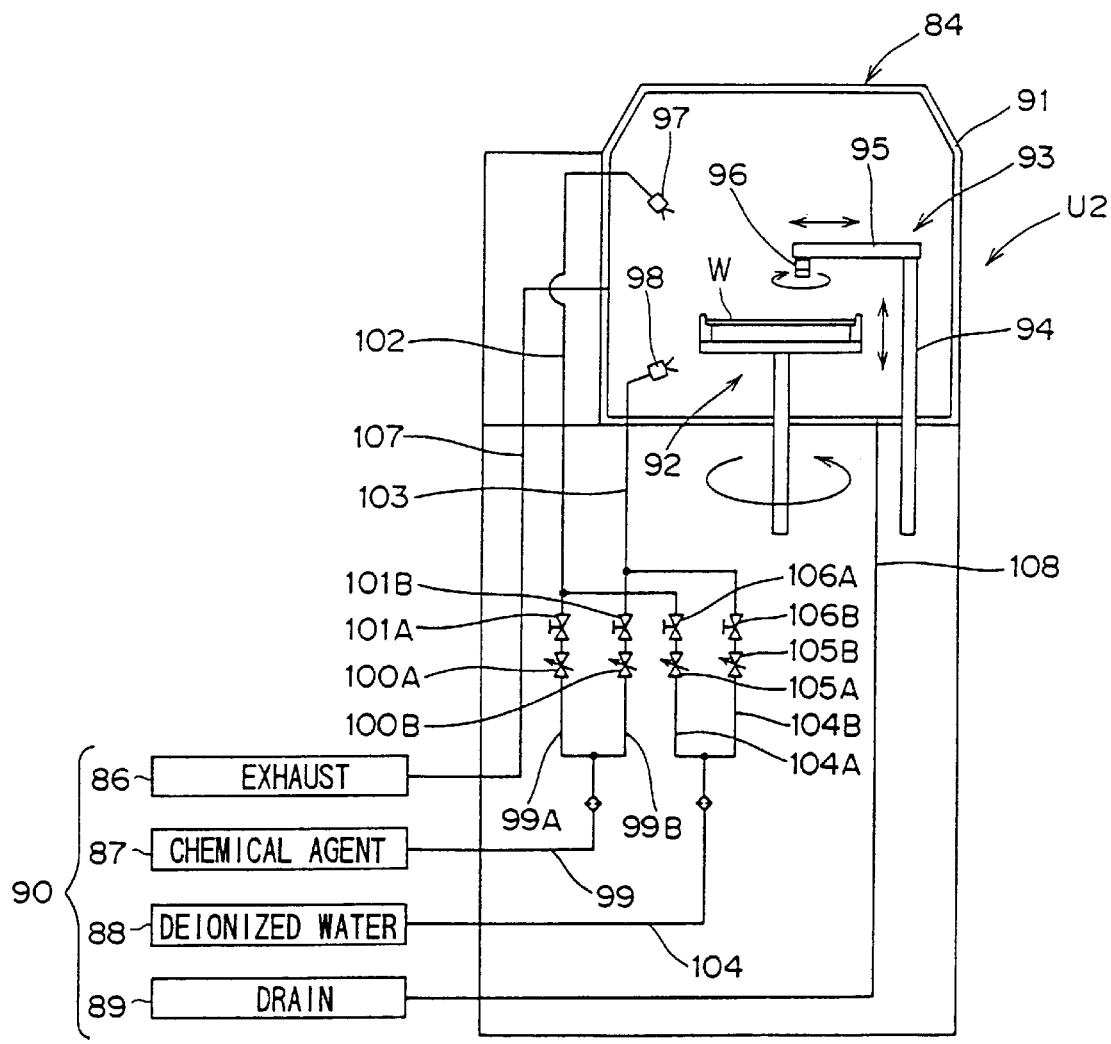

F I G. 12
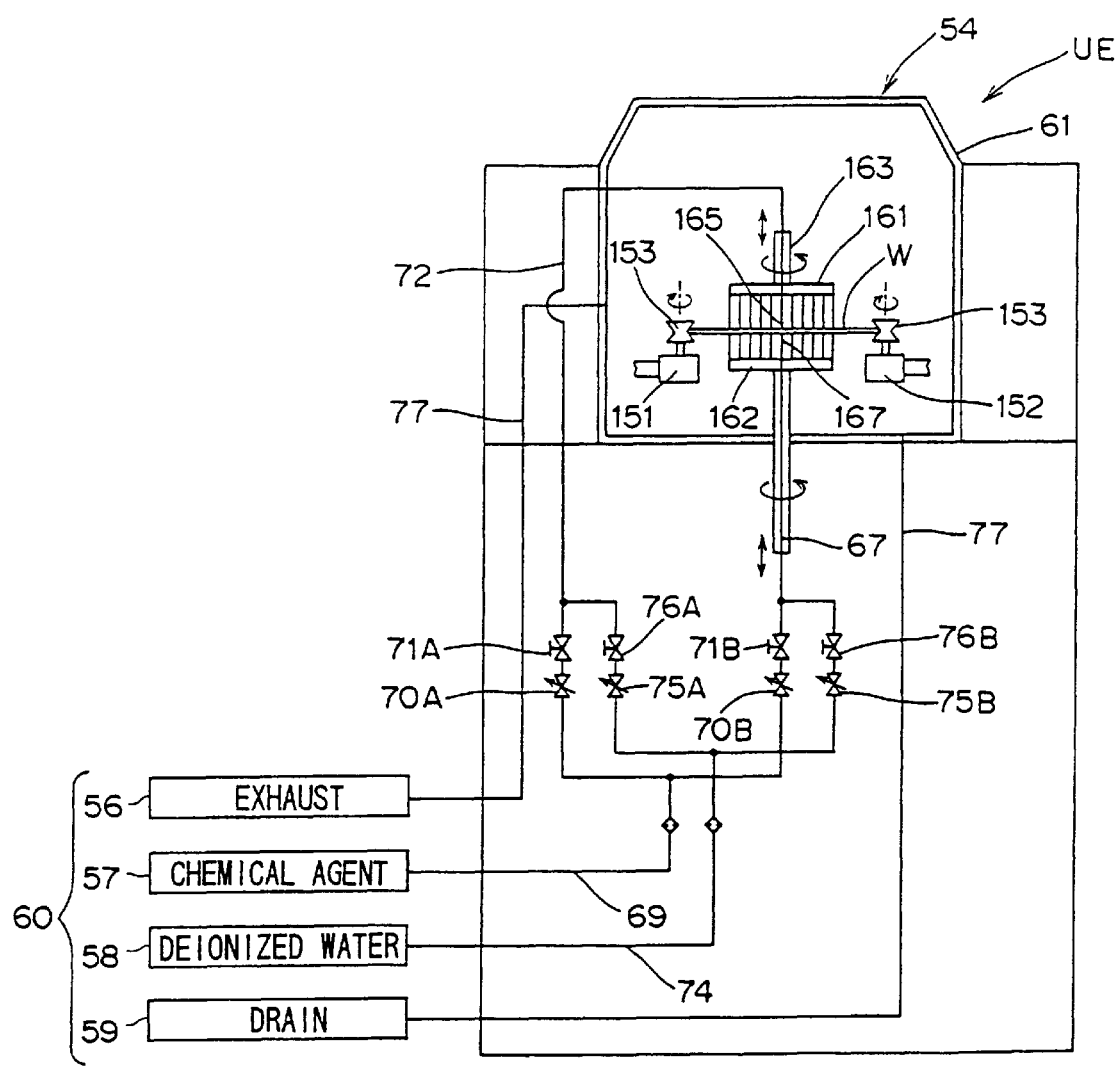

SUBSTRATE PROCESSING UNIT AND SUBSTRATE PROCESSING APPARATUS USING THE SAME

BACKGROUND OF THE INVENTION

1. Field of the Invention

The present invention relates to a substrate processing apparatus for processing substrates such as semiconductor wafers and glass substrates for liquid crystal displays (LCDs) and plasma display panels (PDPs), and to a substrate processing unit to be incorporated in such a substrate processing apparatus.

2. Description of Related Arts

In a semiconductor device production process, a semiconductor wafer (hereinafter referred to simply as "wafer") is subjected to a polishing process for polishing the surface thereof or the surface of a thin film formed thereon (hereinafter referred to generally as "wafer surface") with a slurry as an abrasive. In recent years, the CMP (chemical mechanical polishing) process has often been employed in which a physical polishing process using a slurry and a chemical polishing process utilizing a chemical reaction are performed in combination.

After the CMP process, the slurry and fragments of a film material polished off during the process are present on the wafer surface; therefore, the wafer should be further subjected to a cleaning process. A cleaning apparatus for cleaning a CMP-processed wafer typically has a construction as shown in FIG. 13.

The cleaning apparatus includes a submerged loader 1, a back-side brush-scrubbing unit 2, a front-side brush-scrubbing unit 3, a rinse/dry unit 4 and an unloader 5, which are linearly arranged within a single frame. Transportation robots 6, 7, 8, 9 for transferring wafers between the units on a wafer-by-wafer basis are provided between respective adjacent pairs of units.

The submerged loader 1 holds the CMP-processed wafers immersed in deionized water. The back-side brush-scrubbing unit 2 scrubs the back side of a wafer with a brush while supplying a chemical agent thereto. The front-side brush-scrubbing unit 3 scrubs the front side of the wafer that has been subjected to the back-side scrubbing process with a brush while supplying a chemical agent thereto. The rinse/dry unit 4 rinses the wafer that has been subjected to the front-side scrubbing process with water, and then spin-dries the wafer. The unloader 5 accommodates therein the wafer that has been subjected to the rinse/dry process.

FIG. 14 is a front view of the cleaning apparatus as seen from an arrow A in FIG. 13. The cleaning apparatus further includes a utility connection section 10 provided on a lower portion of a side wall thereof on the side of the arrow A for connecting necessary utilities thereto, and a display section 11 provided above the utility connection section 10 for displaying the flow rates and pressure levels of the utilities.

The utility connection section 10 includes a deionized water connection portion 12, a drain connection portion 13, a chemical agent connection portion 14, an exhaust connection portion 15 and an $N_2$ gas connection portion 16. The deionized water connection portion 12 serves as a deionized water inlet for introducing deionized water into the apparatus from the outside to supply the deionized water into the submerged loader 1, the back-side brush-scrubbing unit 2, the front-side brush-scrubbing unit 3 and the rinse/dry unit 4. The drain connection portion 13 serves as a waste water outlet for discharging waste water from the submerged loader 1, the back-side brush-scrubbing unit 2, the front-side brush-scrubbing unit 3 and the rinse/dry unit 4 to the outside of the apparatus. The chemical agent connection portion 14 serves as a chemical agent inlet for introducing chemical agents into the apparatus from a chemical agent cabinet provided outside the apparatus to supply the chemical agents into the back-side brush-scrubbing unit 2 and the front-side brush-scrubbing unit 3. The exhaust connection portion 15 serves as an exhaust outlet for expelling an unnecessary gas from the back-side brush-scrubbing unit 2, the front-side brush-scrubbing unit 3 and the rinse/dry unit 4. The $N_2$ gas connection portion 16 serves as a gas inlet for introducing $N_2$ gas into the apparatus from the outside to supply the $N_2$ gas into the rinse/dry unit 4.

The display section 11 has deionized water pressure display portions 17 for displaying the pressures of the deionized water supplied to the respective processing units, chemical agent flow rate display portions 18 for displaying the flow rates of the chemical agents supplied to the respective processing units, and an $N_2$ gas flow rate and pressure display portion 19 for displaying the flow rate and pressure of the $N_2$ gas supplied to the rinse/dry unit 4. These display portions 17, 18, 19 are separately provided on the plural processing units.

In the apparatus of the prior art, the utility connection section 10 is connected to the respective units via a plurality of branched pipes within the cleaning apparatus. Therefore, when the arrangement of the processing units is changed at the stage of the design of the apparatus, the pipe arrangement within the cleaning apparatus should be redesigned with a great effort. Further, when the arrangement of the processing units is changed after completion of assembly of the apparatus, the pipe connection within the cleaning apparatus should be re-established with a great effort. Thus, the troublesome operations for the redesign of the pipe arrangement and the re-establishment of the pipe connection impose limitations on the arrangement of the plural processing units. This hinders flexible arrangement of the plural processing units.

As described above, the respective display portions 17, 18, 19 are separately provided on the plural processing units, and are not necessarily located adjacent to the relevant processing units, so that checking of display information is difficult. In order to check an operation being performed in a particular processing unit, an operator has to check all the separately provided display portions 17, 18, 19. That is, the operator cannot check the display portions at a glance. Where a display portion which displays information required for checking the operation of the particular processing unit is located in a position remote from the processing unit, the operator cannot check the display information while visually checking the operation of the processing unit. Hence, the viewability of the display portions is not satisfactory in checking the operations of the processing units.

SUMMARY OF THE INVENTION

In order to overcome the aforesaid technical drawbacks, it is an object of the present invention to provide a substrate processing unit which ensures an improved operation efficiency in performing various operations on a substrate processing apparatus.

It is another object of the present invention to provide a substrate processing apparatus which can readily meet the demands for modifications in substrate processing steps.

It is still another object of the present invention to provide a substrate processing apparatus which features a good viewability in displaying the operating conditions thereof.

The substrate processing unit according to the present invention includes: a substrate processing section for processing a substrate held therein while supplying a process fluid to the substrate; an enclosure enclosing the substrate processing section, and having an opening, formed in a side wall thereof, through which the substrate is carried in and out of the substrate processing section; a process fluid pipe through which the process fluid is supplied to the substrate held in the processing section; and a connector section, provided on a side wall of the enclosure opposite across the substrate processing section from the side wall formed with the opening, for connecting the process fluid pipe to an external process fluid source.

Examples of the process fluid include process liquids such as chemical agents and deionized water, and process gases such as inert gases. The process fluid source may be an independent unit such as a chemical agent cabinet or a utility pipeline provided in a plant. With this arrangement, a plurality of such processing units can readily be integrated as desired into a substrate processing unit assembly, since the processing units each has a connector section for connection to the process fluid source. Where the arrangement of the plural processing units is to be changed as desired, the operations for the redesign of the pipe and the re-establishment of the pipe connection can be performed with an improved efficiency.

Since the connector sections of the respective processing units are provided on the side opposite to the openings for the substrate transfer, the connector sections can unidirectionally be oriented by orienting the openings in the same direction when the processing units are integrated into the substrate processing unit assembly. Therefore, connection pipes can collectively be led to one side, so that the pipe connecting operation can be facilitated.

The substrate processing unit preferably further includes a display section, provided on the side wall of the enclosure opposite across the substrate processing section from the side wall formed with the opening, for displaying the conditions (flow rate, pressure, temperature or concentration) of the process fluid flowing through the process fluid pipe.

With this arrangement, the plurality of processing units can easily be integrated as desired into the processing unit assembly, since the respective processing units has a display section for displaying the conditions of the process fluid supplied to the respective processing units. Therefore, the display sections ensure an improved viewability when the conditions of the process fluid supplied to a particular substrate processing unit are checked.

Since the display sections of the respective processing units are provided on the side opposite to the openings for the substrate transfer, the display sections can unidirectionally be oriented by orienting the openings in the same direction when the processing units are integrated into the processing unit assembly. Therefore, the viewability of the display sections of the respective processing units can further be improved.

The process fluid source may be a process fluid cabinet, provided outside the unit on the side opposite to the opening, which has a tank containing the process fluid.

With this arrangement, where the plurality of processing units are integrated into the processing unit assembly, since the process fluid cabinet can be provided for each of the plural processing units, the substrate processing units can readily be arranged in a desired configuration.

Since the process fluid cabinets are provided on the side opposite to the openings of the processing units, the process fluid cabinets can be aligned on the same side by orienting the openings of the processing units in the same direction. Therefore, operations for replacement of the process fluids in the tanks in the process fluid cabinets can be performed with an improved efficiency.

The substrate processing apparatus according to the present invention includes a plurality of such substrate processing units, which are arranged with the openings thereof being oriented in substantially the same direction.

With this arrangement, the openings of the substrate processing units are oriented in substantially the same direction. As a result, the connector sections and display sections of the respective processing units are oriented in the same direction, and the process fluid cabinets are aligned on the same side. Thus, the operations for the pipe connection and the replacement of the process fluids in the process fluid cabinets can be performed with an improved efficiency, and the viewability of the display sections can be improved.

The substrate processing apparatus may further includes substrate transportation mechanism adapted to be moved to positions opposed to the openings of the respective substrate processing units for transporting a substrate to the respective substrate processing sections of the respective substrate processing units.

With this arrangement, the substrate can efficiently be transported to the respective substrate processing units, because the openings of the respective units are oriented in substantially the same direction and the substrate transportation mechanism is provided on the side of the openings.

The foregoing and other objects, features and effects of the present invention will become more apparent from the following description of the preferred embodiments with reference to the attached drawings.

BRIEF DESCRIPTION OF THE DRAWINGS

FIG. 7 is a sectional view schematically illustrating the internal construction of the front-side brush unit;

FIG. 12 is a sectional view schematically illustrating the internal construction of the double-side brush unit;

DESCRIPTION OF THE PREFERRED EMBODIMENTS

Figure 1:
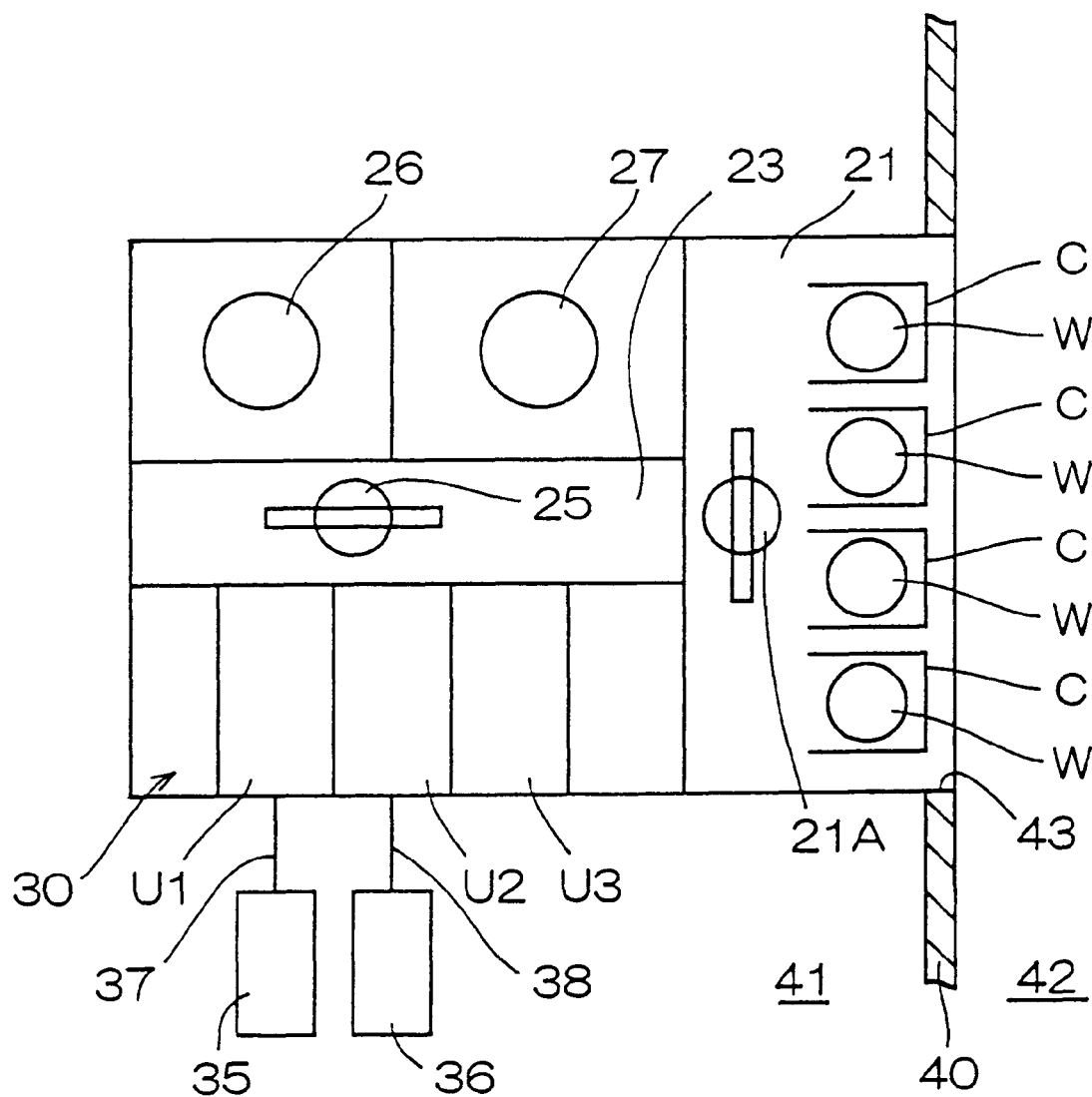
FIG. 1 is a schematic plan view illustrating a substrate processing apparatus according to one embodiment of the present invention.

FIG. 1 is a schematic plan view illustrating a substrate processing apparatus according to one embodiment of the present invention. The substrate processing apparatus includes a loader/unloader section 21 provided at one end thereof and capable of holding a plurality of cassettes C for accommodating therein unprocessed wafers W and processed wafers W. The loader/unloader section 21 has a loader/unloader robot 21A for carrying a wafer W in and out of the respective cassettes C. In the substrate processing apparatus, a linear transportation path 23 is provided which extends along a center line of the apparatus perpendicularly to the linear arrangement of the plurality of cassettes C in the loader/unloader section 21. A transportation robot 25 (substrate transportation mechanism), which is reciprocally and linearly movable along the transportation path 23, is provided on the transportation path 23.

Processing sections 26 and 27 for performing predetermined process operations are arranged parallel to the transportation path 23 on one side thereof, and a built-in section 30 in which necessary processing units are incorporated is provided parallel to the transportation path 23 on the other side thereof. Incorporated in the built-in section 30 are, for example, a back-side brush-scrubbing unit U1, a front-side brush-scrubbing unit U2 and a rinse/dry unit U3. The back-side brush-scrubbing unit U1 is used for brush-scrubbing the back side of a CMP-processed wafer W. The front-side brush-scrubbing unit U2 is used for brush-scrubbing the front side of the wafer W that has been subjected to the back-side brush-scrubbing process. The rinse/dry unit U3 is used for rinsing the wafer W that has been subjected to the front-side brush-scrubbing process with water and then spin-drying the wafer W.

Where chemical agents are used in the back-side brush-scrubbing unit U1 and the front-side brush-scrubbing unit U2, for example, chemical agent cabinets (process fluid cabinet) 35 and 36 provided outside the apparatus are connected to connector sections of the back-side brush-scrubbing unit U1 and the front-side brush-scrubbing unit U2 via pipes 37 and 38, respectively. The chemical agent cabinets 35 and 36 each has a tank therein which contains a required chemical agent (e.g., hydrofluoric acid).

The processing sections 26, 27 and the processing units incorporated in the built-in section 30 each has an opening which faces the transportation path 23. The transportation robot 25 moves along the transportation path to positions opposed to the openings for carrying a wafer W in and out of the processing sections 26, 27 and the processing units U1, U2, U3. Further, the transportation robot 25 can transfer the wafer W to and from the loader/unloader robot 21A.

The transportation robot 25 includes, for example, a linear drive mechanism for reciprocal linear movement thereof along the transportation path 23, a hand for holding a wafer W, a hand retracting mechanism for moving the hand back and forth with respect to the processing sections 26, 27 and the processing units incorporated in the built-in section 30, a pivot mechanism for pivoting the hand retracting mechanism about a vertical axis, and an elevation mechanism for vertically moving the hand retracting mechanism. The linear drive mechanism and the elevation mechanism may each include a ball screw mechanism.

The substrate processing apparatus is disposed in a room 41 separated from another room 42 by a partition 40 having a window 43, and the loader/unloader section 21 faces the room 42 through the window 43.

Figure 2A:
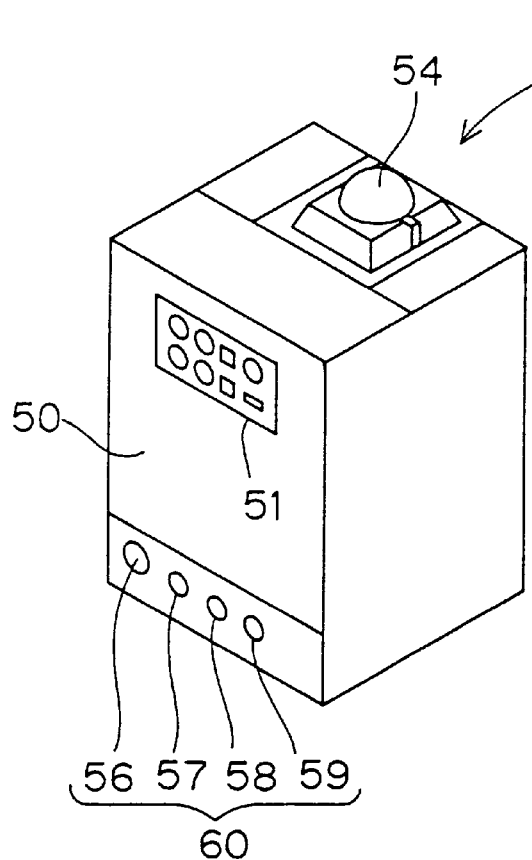
FIGS. 2A and 2B are perspective views of a back-side brush unit.
Figure 2B:
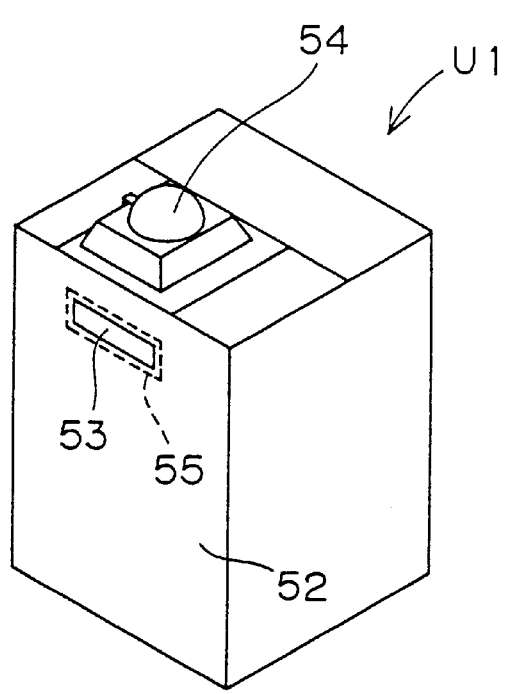

FIGS. 2A and 2B are perspective views of the back-side brush unit U1 and, particularly, FIG. 2B shows the unit of FIG. 2A rotated by 180 degrees about the vertical axis thereof. The back-side brush unit U1 has a display section 51 provided on a front panel 50 thereof which is exposed to the outside of the substrate processing apparatus. The display section 51 includes measuring instruments which display the flow rates and pressure levels of the process liquids flowing through pipes within the unit. A rear panel 52 of the unit U1 which faces the transportation path 23 has an opening 53 through which a wafer W is carried in and out of the unit U1.

A processing section 54 (substrate processing section) for performing a brush-scrubbing operation on the surface of the wafer W is disposed adjacent to the rear panel 52. A shutter 55 for opening and closing the opening 53 is provided adjacent to the opening 53 inwardly of the rear panel 52. When the shutter 55 is open, the wafer W can be carried in and out of the processing section 54 through the opening 53. A utility connector section 60 (connector section) including an exhaust pipe connector 56, a chemical agent supply pipe connector 57, a deionized water supply pipe connector 58 and a drain pipe connector 59 is provided in a lower portion of the front panel 50. The exhaust pipe connector 56, the deionized water supply pipe connector 58 and the drain pipe connector 59, for example, are connected to utility pipes provided in a plant, and the chemical agent supply pipe connector 57 is connected to the chemical agent supply cabinet 35 (see FIG. 1) via the pipe 37.

Figure 3:
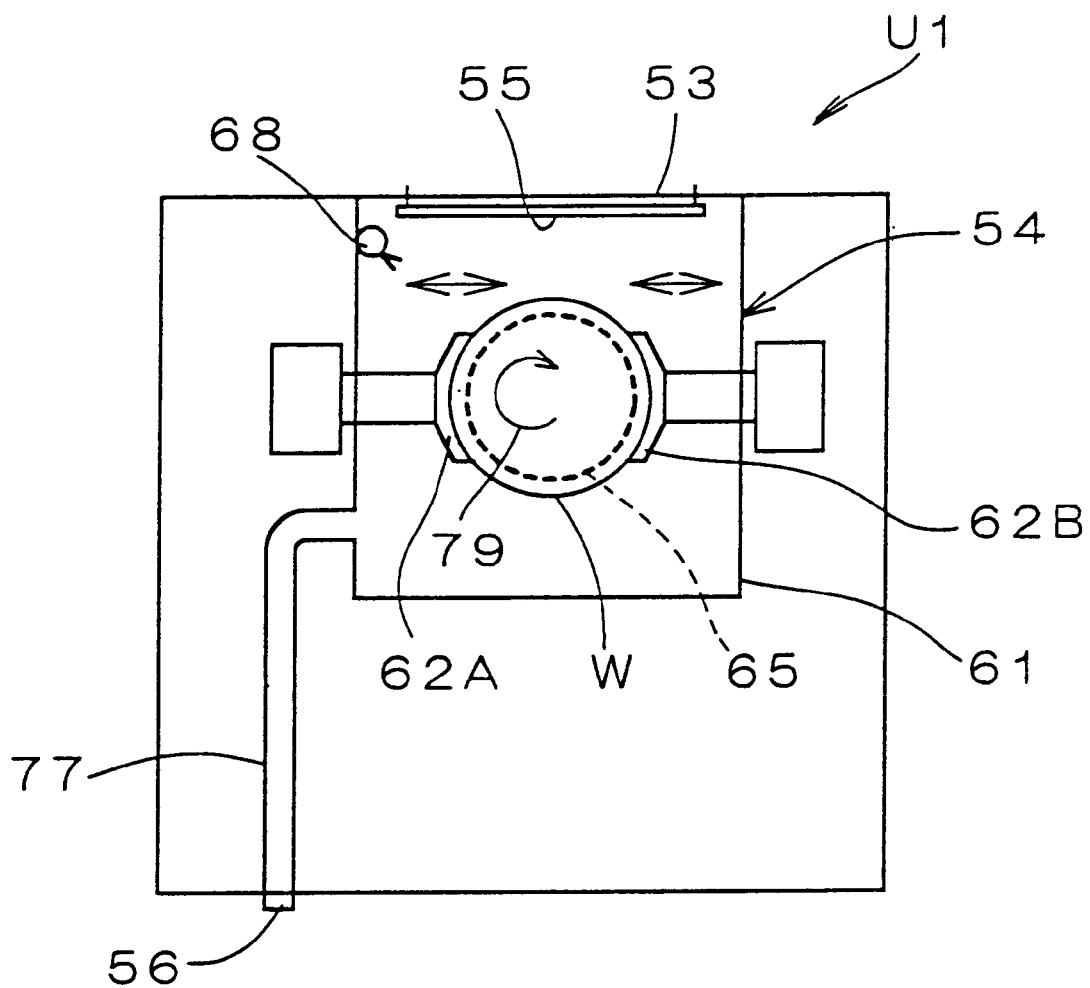
FIG. 3 is a plan view schematically illustrating the internal construction of the back-side brush unit.
Figure 4:
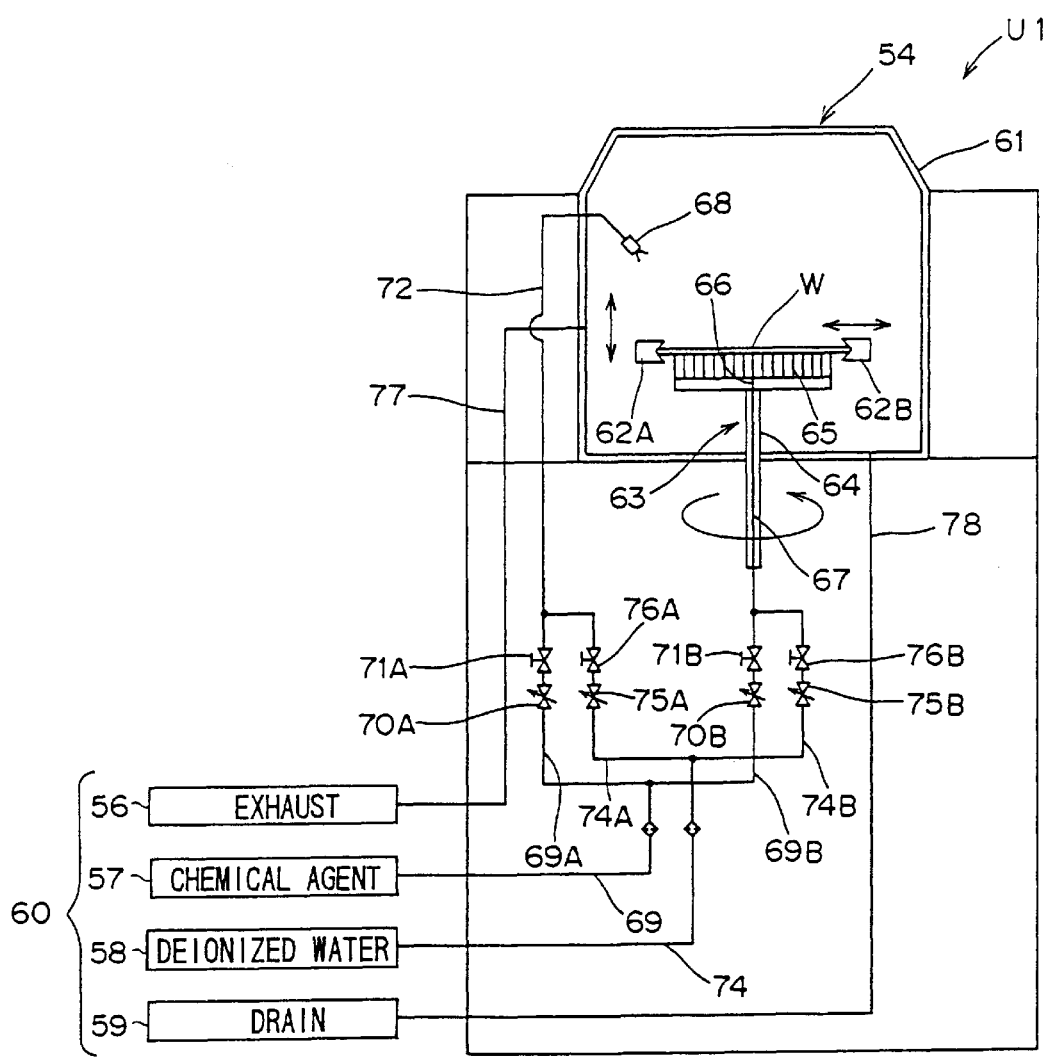
FIG. 4 is a sectional view schematically illustrating the internal construction of the back-side brush unit.

FIGS. 3 and 4 are a plan view and a sectional view, respectively, which schematically illustrate the internal construction of the back-side brush unit U1. The processing section 54 is enclosed by an enclosure 61. A pair of edge retention hands 62A and 62B for horizontally holding a wafer W therebetween in contact with edge portions of the wafer W is provided in a space defined within the enclosure 61. The edge retention hands 62A and 62B are movable toward and away from each other for holding and releasing the wafer W. The edge retention hands 62A and 62B can synchronously be moved vertically, and put in a small circular motion within a horizontal plane. The opening 53 is formed in a side wall of the enclosure 61, and the shutter 55 is vertically slidably provided in association with the opening 53.

A back-side brush device 63 for scrubbing the back side of the wafer W is provided below a wafer holding position where the wafer W is held by the edge retention hands 62A and 62B within the processing section 54. The back-side brush device 63 has a hollow rotation shaft 64 driven rotatively about a vertical axis by a rotative drive mechanism not shown, and a disk brush 65 horizontally provided at the upper end of the rotation shaft 64. A process liquid supply pipe 67 extends through the rotation shaft 64, and is connected to a back-side nozzle 66 for supplying the process liquid (deionized water or chemical agent) toward the center of the back side of the wafer W.

An upper nozzle 68 for supplying the process liquid (deionized water or chemical agent) toward the upper surface of the wafer W held by the edge retention hands 62A and 62B is provided at a laterally upper side of the wafer holding position within the processing section 54.

The chemical agent supply pipe connector 57 is connected to a chemical agent supply pipe 69, which is branched into two chemical agent supply pipes 69A and 69B. These two chemical agent supply pipes 69A and 69B are provided with flow rate control valves 70A and 70B and pneumatic valves 71A and 71B, respectively. The chemical agent supply pipe 69A is connected to the upper nozzle 68 through a chemical agent supply pipe 72, while the chemical agent supply pipe 69B is connected to the back-side nozzle 66 through the process liquid supply pipe 67.

Similarly, the deionized water supply pipe connector 58 is connected to a deionized water supply pipe 74, which is branched into two deionized water supply pipes 74A and 74B. These two deionized water supply pipes 74A and 74B are provided with flow rate control valves 75A and 75B and pneumatic valves 76A and 76B, respectively. The deionized water supply pipe 74A joins the process liquid supply pipe 72 connected to the upper nozzle 68, while the deionized water supply pipe 74B joins the process liquid supply pipe 67 connected to the back-side nozzle 66.

One end of an exhaust pipe 77 is open up in a side wall of the enclosure 61 of the processing section 54, while the other end of the exhaust pipe 77 is connected to the exhaust pipe connector 56. One end of a drain pipe 78 is open up in the bottom of the enclosure 61 of the processing section 54, while the other end of the drain pipe 78 is connected to the drain pipe connector 59.

With this arrangement, the chemical agent or deionized water can be supplied toward the upper and lower surfaces of the wafer W from the upper nozzle 68 and the back-side nozzle 66 by selectively opening the pneumatic valves 71A, 71B, 76A and 76B. Further, a gas is expelled from the processing section 54 through the exhaust pipe 77, and the process liquid used for the processing of the wafer W is drained through the drain pipe 78 for collection or disposal thereof.

For scrub-cleaning of the back side of the wafer W, the back side of the wafer W is brought into contact with the disk brush 65 by lowering the edge retention hands 62A and 62B holding the wafer W therebetween with the disk brush 65 kept rotated by rotating the rotation shaft 64 of the back-side brush device 63. During the scrub-cleaning, the edge retention hands 62A and 62B are moved in a small circular motion within the horizontal plane so that the wafer W is moved in a circular motion as shown by an arrow 79 in FIG. 3. Thus, varying portions on the wafer W are scrubbed with the disk brush 65, so that substantially the entire back side of the wafer W can be scrubbed.

Figure 5A:
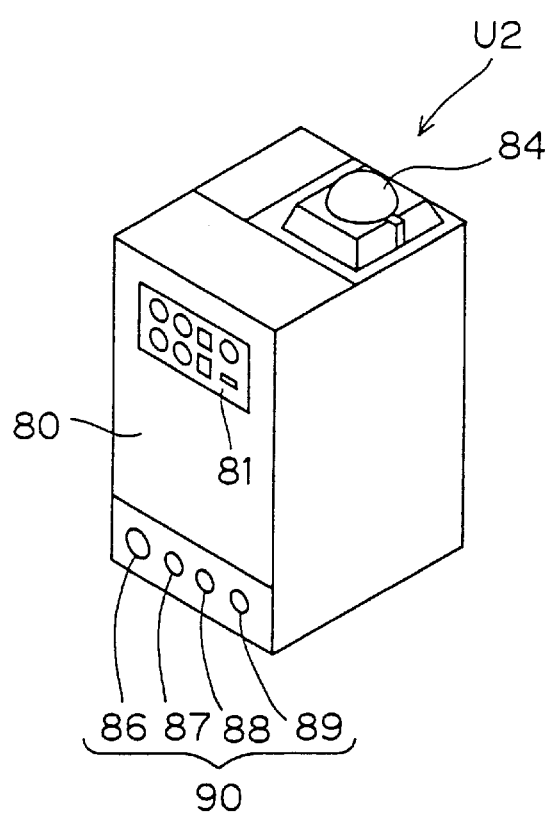
FIGS. 5A and 5B are perspective views of a front-side brush unit.
Figure 5B:
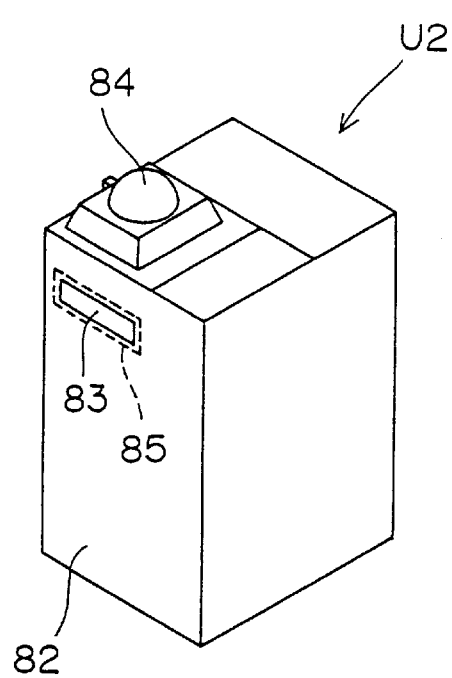

FIGS. 5A and 5B are perspective views of the front-side brush unit U2, and FIG. 5B shows the unit of FIG. 5A rotated by 180 degrees about the vertical axis thereof. The front-side brush unit U2 has a display section 81 provided on a front panel 80 thereof which is exposed to the outside of the substrate processing apparatus. The display section 81 includes measuring instruments which display the flow rates and pressure levels of the process liquids flowing through pipes within the unit. A rear panel 82 of the unit U2 which faces the transportation path 23 has an opening 83 through which a wafer W is carried in and out of the unit U2.

A processing section 84 (substrate processing section) for performing a brush-scrubbing operation on the surface of the wafer W is disposed adjacent to the rear panel 82. A shutter 85 for opening and closing the opening 83 is provided adjacent to the opening 83 inwardly of the rear panel 82. When the shutter 85 is open, the wafer W can be carried in and out of the processing section 84 through the opening 83. A utility connecting section 90 (connector section) including an exhaust pipe connector 86, a chemical agent supply pipe connector 87, a deionized water supply pipe connector 88 and a drain pipe connector 89 is provided in a lower portion of the front panel 80. The exhaust pipe connector 86, the deionized water supply pipe connector 88 and the drain pipe connector 89, for example, are connected to the utility pipes provided in the plant, and the chemical agent supply pipe connector 87 is connected to the chemical agent supply cabinet 36 (see FIG. 1) via the pipe 38.

Figure 6:
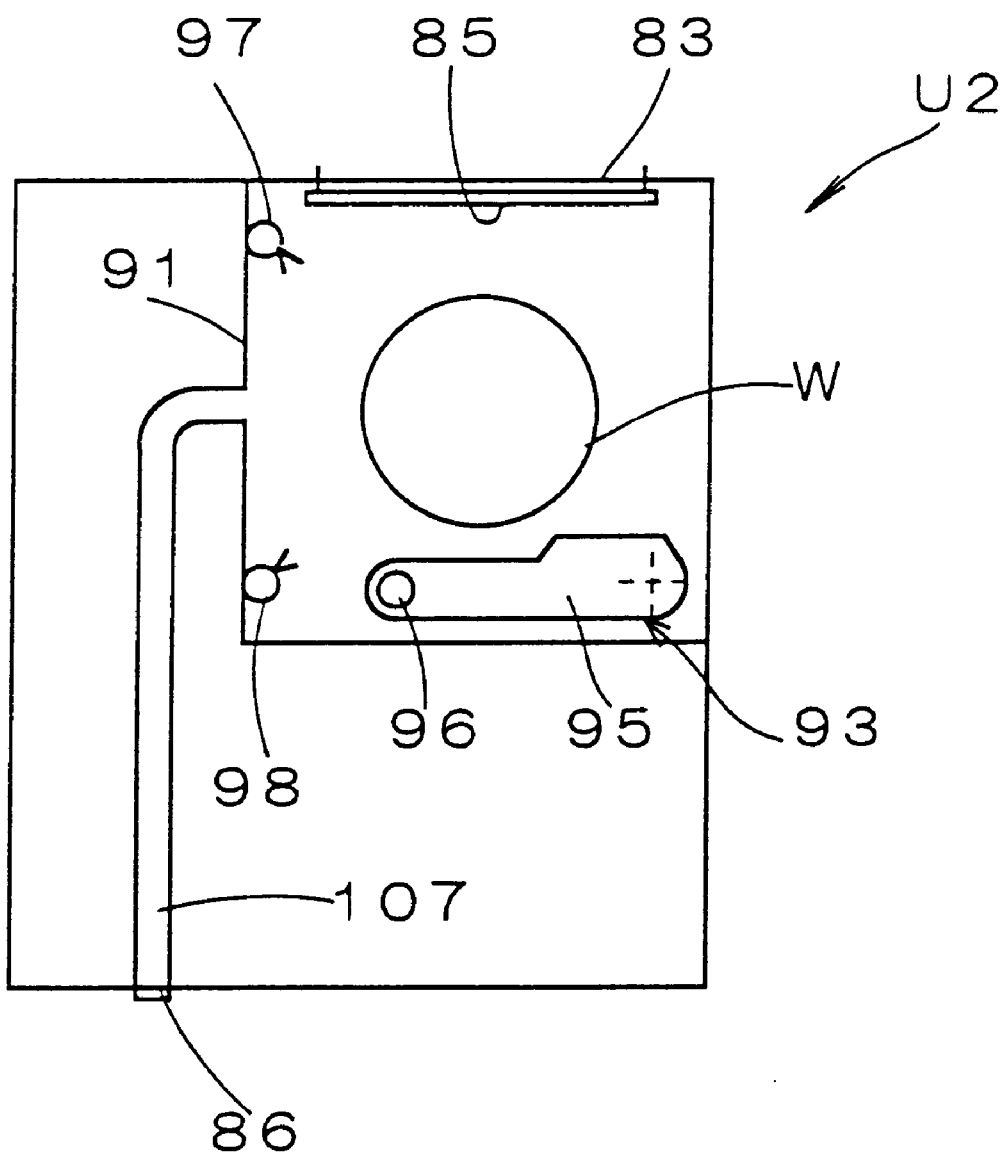
FIG. 6 is a plan view schematically illustrating the internal construction of the front-side brush unit.

FIGS. 6 and 7 are a plan view and a sectional view, respectively, which schematically illustrate the internal construction of the front-side brush unit U2. The processing section 84 is enclosed by an enclosure 91. A spin chuck 92 which rotates about the vertical axis thereof with a wafer W being horizontally held thereon is provided in a space defined within the enclosure 91. The opening 83 is formed in a side wall of the enclosure 91, and the shutter 85 is vertically slidably provided in association with the opening 83.

A scan brush device 93 is provided at a lateral side of the spin chuck 92. The scan brush device 93 has a rotation shaft 94 extending vertically, a pivot arm 95 fixed at the upper end of the rotation shaft 94, and a disk brush 96 rotatably provided at the distal end of the pivot arm 95. The disk brush 96 is located above the spin chuck 92 as being opposed to the upper face of the wafer W held on the spin chuck 92. The scan brush device 93 further includes a rotative drive mechanism for reciprocally pivoting the pivot arm 95 within a predetermined angular range by rotating the rotation shaft 94, an elevation mechanism for vertically moving the pivot arm 95 by vertically moving the rotation shaft 94, and a brush rotating mechanism for rotating the disk brush 96 about the vertical axis thereof.

For scrubbing of the front side of the wafer W, the disk brush 96 is rotated in contact with the front side of the wafer W while being scanned by pivoting the pivot arm 95 from the center to the periphery of the wafer W. When the disk brush 96 reaches the periphery of the wafer W, the pivot arm 95 is moved up, whereby the disk brush 96 is brought away from the wafer W. In turn, the pivot arm 95 is pivoted toward the rotation center of the wafer W so that the disk brush 96 is returned to the center of the wafer W. Then, the aforesaid scrubbing operation is repeated.

An upper nozzle 97 for supplying the chemical agent or deionized water toward the upper surface of the wafer W and a lower nozzle 98 for supplying the chemical agent or deionized water toward the lower surface of the wafer W are respectively provided above and below the wafer holding position at a lateral side of the spin chuck 92.

The chemical agent supply pipe connector 87 is connected to a chemical agent supply pipe 99, which is branched into two chemical agent supply pipes 99A and 99B. These two chemical agent supply pipes 99A and 99B are provided with flow rate control valves 100A and 100B and pneumatic valves 101A and 101B, respectively. The chemical agent supply pipe 99A is connected to the upper nozzle 97 through a chemical agent supply pipe 102, while the chemical agent supply pipe 99B is connected to the lower nozzle 98 through the process liquid supply pipe 103.

Similarly, the deionized water supply pipe connector 88 is connected to a deionized water supply pipe 104, which is branched into two deionized water supply pipes 104A and 104B. These two deionized water supply pipes 104A and 104B are provided with flow rate control valves 105A and 105B and pneumatic valves 106A and 106B, respectively. The deionized water supply pipe 104A joins the process liquid supply pipe 102 connected to the upper nozzle 97, while the deionized water supply pipe 104B joins the process liquid supply pipe 103 connected to the lower nozzle 98.

One end of an exhaust pipe 107 is open up in a side wall of the enclosure 91 of the processing section 84, while the other end of the exhaust pipe 107 is connected to the exhaust pipe connector 86. One end of a drain pipe 108 is open up in the bottom of the enclosure 91 of the processing section 84, while the other end of the drain pipe 89 is connected to the drain pipe connector 89.

With this arrangement, the chemical agent or deionized water can be supplied toward the upper and lower surfaces of the wafer W from the upper nozzle 97 and the lower nozzle 98 by selectively opening the pneumatic valves 101A, 101B, 106A and 106B. Further, a gas is expelled from the processing section 84 through the exhaust pipe 107, and the process liquid used for the processing of the wafer W is drained through the drain pipe 108 for collection or disposal thereof.

Figure 8A:
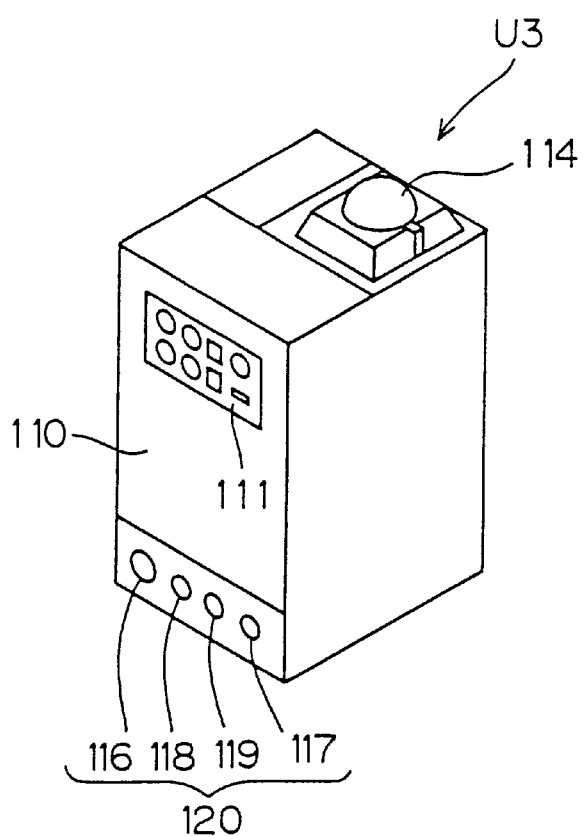
FIGS. 8A and 8B are perspective views of a rinse/dry unit.
Figure 8B:
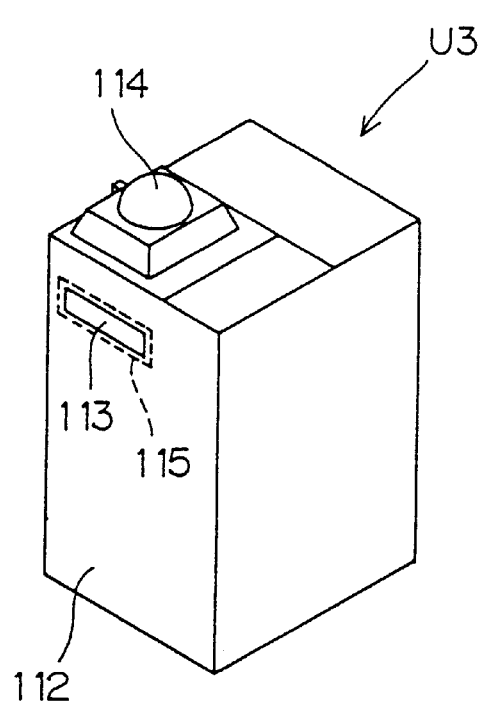

FIGS. 8A and 8B are perspective views of the rinse/dry unit U3, and FIG. 8B shows the unit of FIG. 8A rotated by 180 degrees about the vertical axis thereof. The rinse/dry unit U3 has a display section 111 provided on a front panel 110 thereof which is exposed to the outside of the substrate processing apparatus. The display section 111 includes measuring instruments which display the flow rates and pressure levels of the process liquids and process gas (e.g., $N_2$ gas) flowing through pipes within the unit. A rear panel 112 of the unit U3 which faces the transportation path 23 has an opening 113 through which a wafer W is carried in and out of the unit U3. A processing section 114 (substrate processing section) for performing a rinse/dry operation on the surfaces of the wafer W is disposed adjacent to the rear panel 112. A shutter 115 for opening and closing the opening 113 is provided adjacent to the opening 113 inwardly of the rear panel 112. When the shutter 115 is open, the wafer W can be carried in and out of the processing section 114 through the opening 113. A utility connecting section 120 (connector section) including an exhaust pipe connector 116, an $N_2$ gas supply pipe connector 117, a deionized water supply pipe connector 118 and a drain pipe connector 119 is provided in a lower portion of the front panel 110.

The exhaust pipe connector 116, the $N_2$ gas supply pipe connector 116, the deionized water supply pipe connector 118 and the drain pipe connector 119, for example, are connected to the utility pipes provided in the plant.

Figure 9:
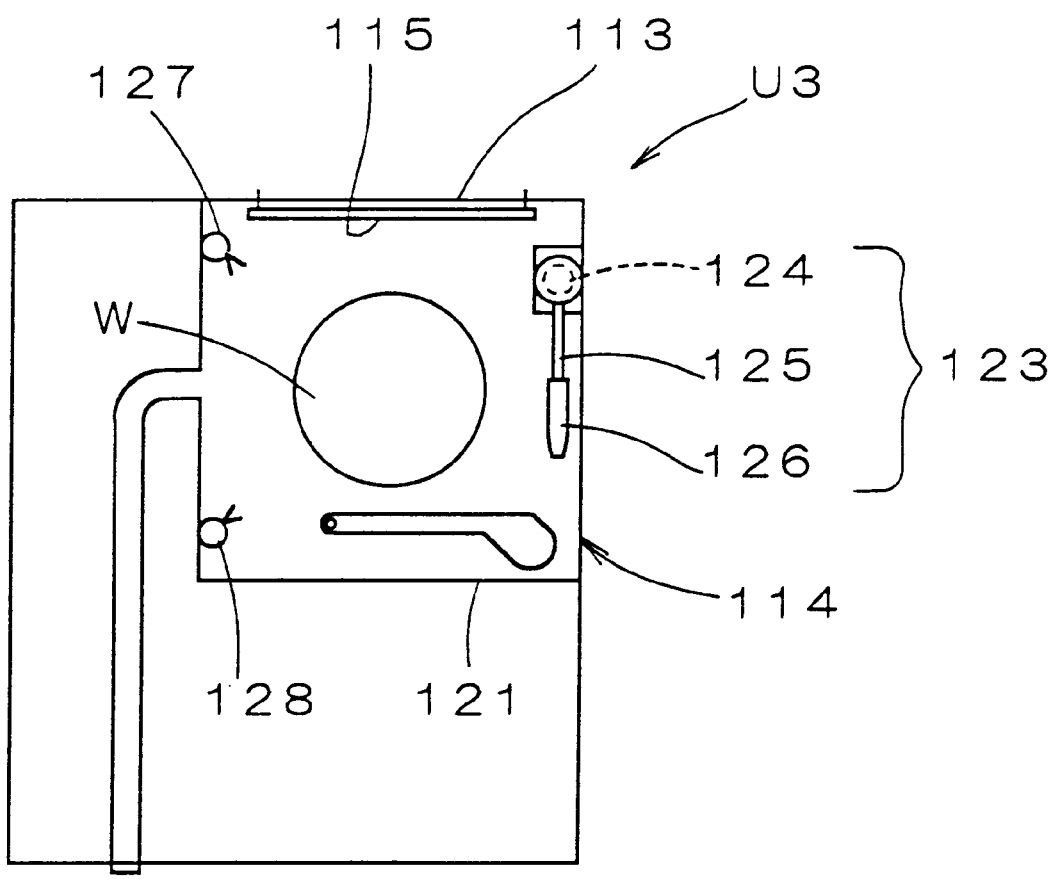
FIG. 9 is a plan view schematically illustrating the internal construction of the rinse/dry unit.
Figure 10:
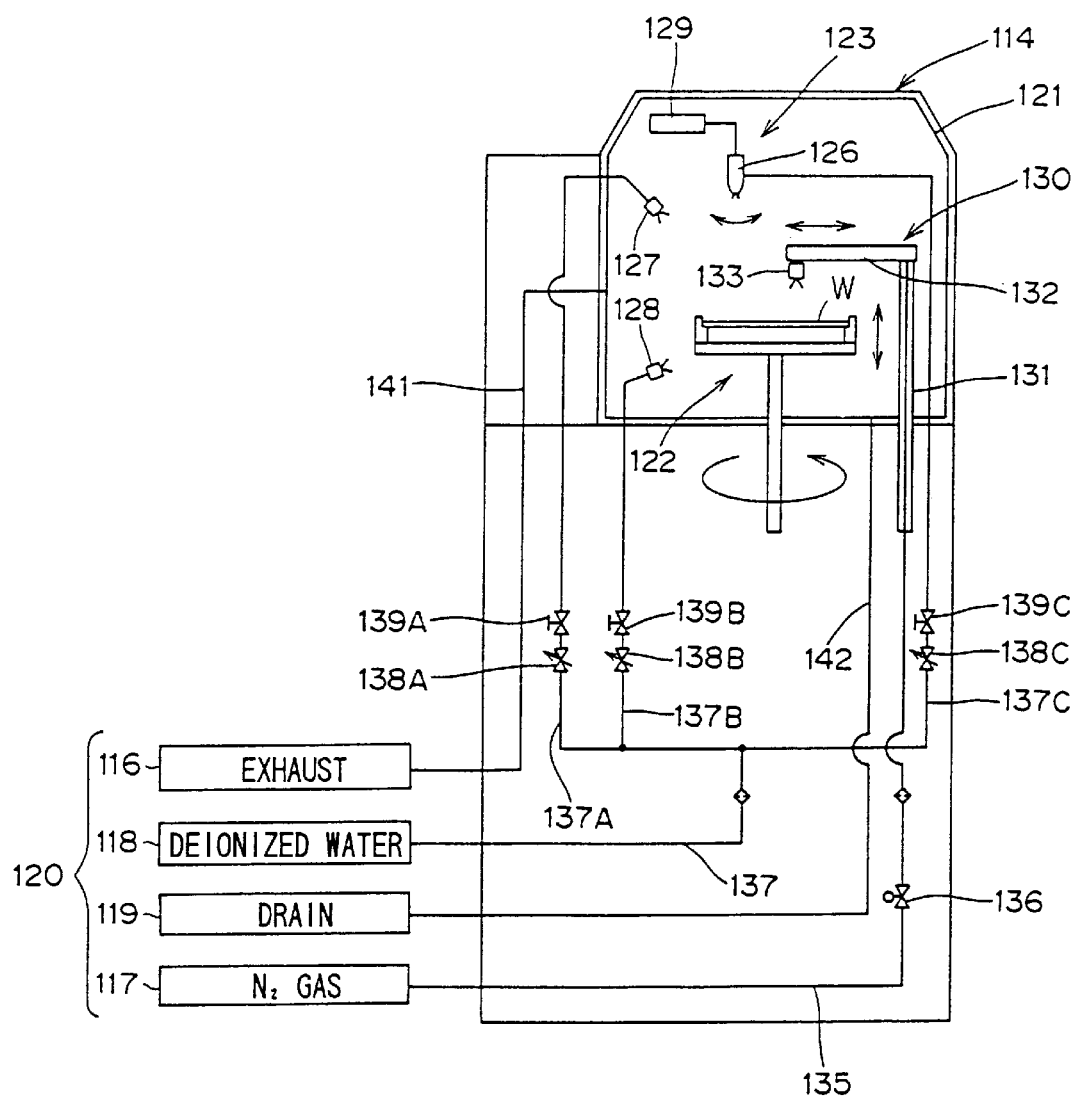
FIG. 10 is a sectional view schematically illustrating the internal construction of the rinse/dry unit.

FIGS. 9 and 10 are a plan view and a sectional view, respectively, which schematically illustrate the internal construction of the rinse/dry unit U3. The processing section 114 is enclosed by an enclosure 121. A spin chuck 122 which rotates about the vertical axis thereof with a wafer W being horizontally held thereon is provided in a space defined within the enclosure 121. The opening 113 is formed in a side wall of the enclosure 121, and the shutter 115 is vertically slidably provided in association with the opening 113.

An upper nozzle 127 for supplying deionized water toward the upper surface of the wafer W and a lower nozzle 128 for supplying deionized water toward the lower surface of the wafer W are provided at a lateral side of the spin chuck 122.

An ultrasonic cleaning device 123 is, as required, provided at a lateral side of the spin chuck 122. The ultrasonic cleaning device 123 has a rotation shaft 124 extending vertically, a pivot arm 125 fixed at the upper end of the rotation shaft 124, and an ultrasonic cleaning head 126 attached at the distal end of the pivot arm 125. By pivoting the pivot arm 125, the ultrasonic cleaning head 126 is moved to be located above the spin chuck 122 as being opposed to the upper surface of the wafer W held on the spin chuck 122. The ultrasonic cleaning device 123 further includes a rotative drive mechanism for reciprocally pivoting the pivot arm 125 within a predetermined angular range by rotating the rotation shaft 124, an elevation mechanism for vertically moving the pivot arm 125 by vertically moving the rotation shaft 124, and a driving circuit 129 for driving a vibration plate incorporated in the ultrasonic cleaning head 126 for vibration thereof.

An $N_2$ drying device 130 for drying the surfaces of the wafer W by spraying an inert gas such as $N_2$ gas thereon is provided at a lateral side of the spin chuck 112. The $N_2$ drying device 130 has a rotation shaft 131 vertically extending, a pivot arm 132 fixed at the upper end of the rotation shaft 131, and an $N_2$ nozzle 133 attached at the distal end of the pivot arm 132. By pivoting the pivot arm 132, the $N_2$ nozzle 133 is moved to be located above the spin chuck 122 as being opposed to the upper surface of the wafer W held on the spin chuck 122. The $N_2$ drying device 130 further includes a rotative drive mechanism for reciprocally pivoting the pivot arm 132 within a predetermined angular range by rotating the rotation shaft 131 and an elevation mechanism for vertically moving the pivot arm 132 by vertically moving the rotation shaft 131.

The $N_2$ gas supply connector 117 is connected to an $N_2$ supply pipe 135, which extends through the rotation shaft 131 and the pivot arm 132 so as to be connected to the $N_2$ nozzle 133. The $N_2$ supply pipe 135 is provided with a pneumatic valve 136 for switching on and off of the supply of the $N_2$ gas.

The deionized water supply pipe connector 118 is connected to a deionized water supply pipe 137, which is branched into three deionized water supply pipes 137A, 137B and 137C. These three deionized water supply pipes 137A, 137B and 137C are provided with flow rate control valves 138A, 138B and 138C and pneumatic valves 139A, 139B and 139C, respectively. The deionized water supply pipe 137A is connected to the upper nozzle 127, and the deionized water supply pipe 137B is connected to the lower nozzle 128. The deionized water supply pipe 137C is connected to the ultrasonic cleaning head 126.

One end of an exhaust pipe 141 is open up in a side wall of the enclosure 121 of the processing section 114, while the other end of the exhaust pipe 141 is connected to the exhaust pipe connector 116. One end of a drain pipe 142 is open up in the bottom of the enclosure 121 of the processing section 114, while the other end of the drain pipe 142 is connected to the drain pipe connector 119.

With this arrangement, the deionized water can be supplied toward the upper and lower surfaces of the wafer W from the upper nozzle 127 and the lower nozzle 128 by opening the pneumatic valves 139A and 139B. Further, deionized water imparted with ultrasonic vibration can be supplied onto the upper surface of the wafer W by pivoting the pivot arm 125 with the pneumatic valve 139C being open.

After the wafer W is rinsed with the deionized water and with the deionized water imparted with ultrasonic vibration, the supply of the deionized water is stopped. Then, the spin chuck 122 is rotated at a high speed for spin-drying of the wafer W and, simultaneously, the wafer W is subjected to a drying operation by the $N_2$ drying device 130. More specifically, the pivot arm 132 is pivoted with the pneumatic valve 136 being open to spray the $N_2$ gas onto the surface of the wafer W.

The gas within the processing section 114 is expelled through the exhaust pipe 141, and the process liquid used for the processing of the wafer W is drained through the drain pipe 142 for collection or disposal thereof. As described in the forgoing and illustrated in the drawings, the back-side brush unit U1, the front-side brush unit U2 and the rinse/dry unit U3 respectively have the display sections 51, 81 and 111 and the utility connection sections 60, 90 and 120 on their front panels 50, 80 and 110, and the openings 53, 83 and 113 for the wafer transfer on their rear panels 52, 82 and 112. These units can readily be incorporated in the built-in section 30 of the substrate processing apparatus as required, and independently replaced with another processing unit. Since the utility connection sections 60, 90 and 120 are provided on the front panels 50, 80 and 110, the chemical agent cabinets 35 and 36 can readily be connected to the substrate processing apparatus on the front side thereof.

Since the back-side brush unit U1, the front-side brush unit U2 and the rinse/dry unit U3 respectively have the display sections 51, 81 and 111 on their front panels 50, 80 and 110, an operator can check information displayed on the display sections 51, 81 and 111, while observing the processing operations of the respective processing units U1, U2 and U3. This arrangement improves the viewability of the display sections 51, 81 and 111. Since the utility connection sections 60, 90 and 120 are also provided on the front panels 50, 80 and 110, the pipe connecting operations can be performed more efficiently. Further, the chemical agent cabinets 35 and 36 are located on the same side of the substrate processing apparatus, so that the operations for the replacement of the chemical agents in the tanks in the cabinets can be carried out more efficiently.

When the processing units U1, U2 and U3 are to be arranged in a different sequence or to be replaced with another processing unit due to alteration in the process flow, the positions of the respective processing units U1, U2 and U3 within the processing apparatus should be changed as desired. In such a case, the embodiment of the present invention facilitates the redesign of the pipe arrangement and the re-establishment of the pipe connection, because the processing units U1, U2 and U3 independently have the utility connection sections 60, 90 and 120 and the display sections 51, 81 and 111.

Figure 11:
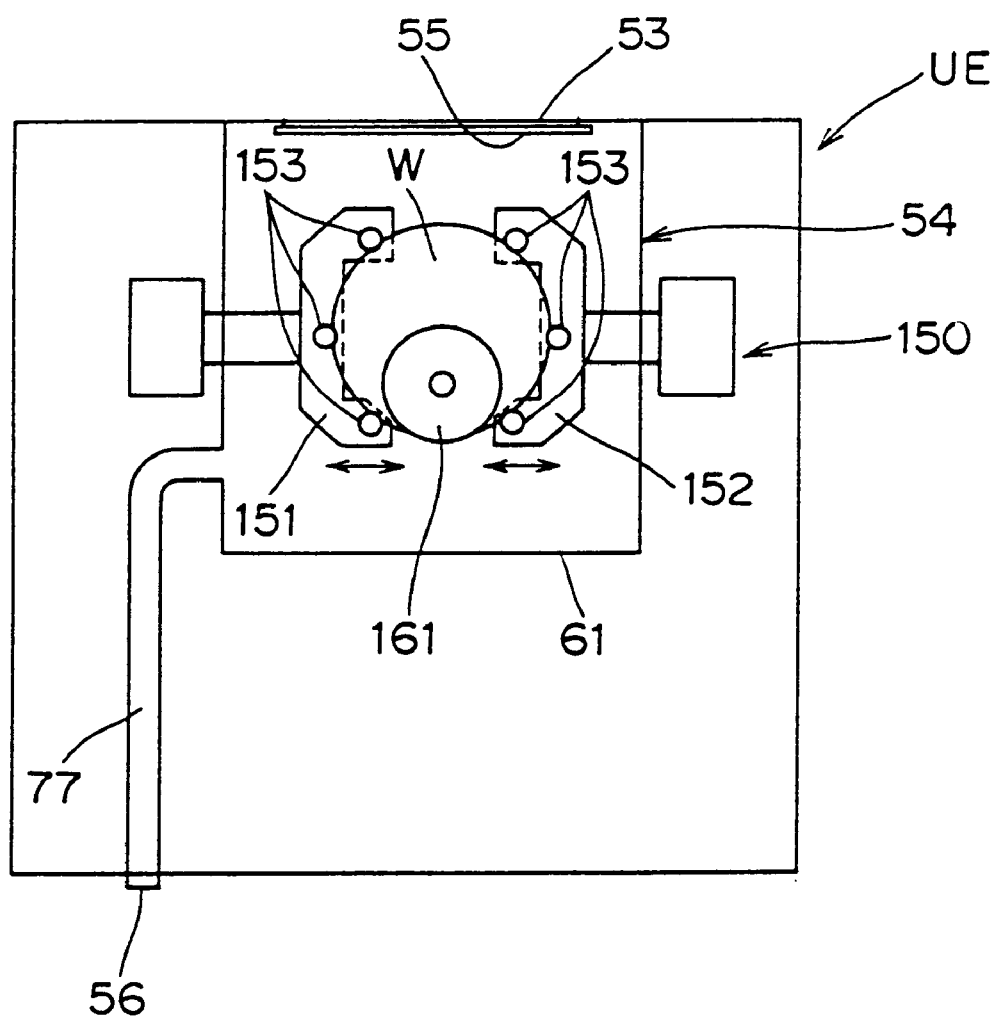
FIG. 11 is a plan view schematically illustrating the internal construction of a double-side brush unit.
Figure 13:
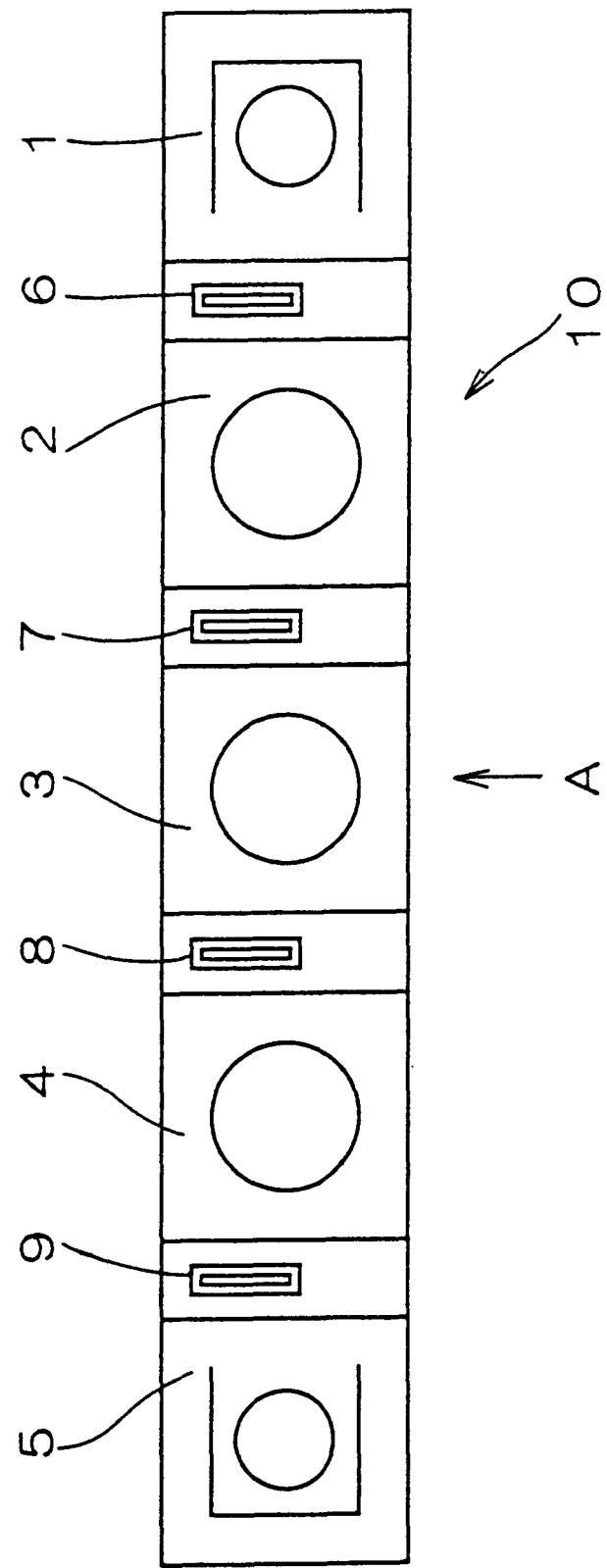
FIG. 13 is a schematic plan view illustrating the construction of a conventional apparatus for cleaning a CMP processed wafer.
Figure 14:
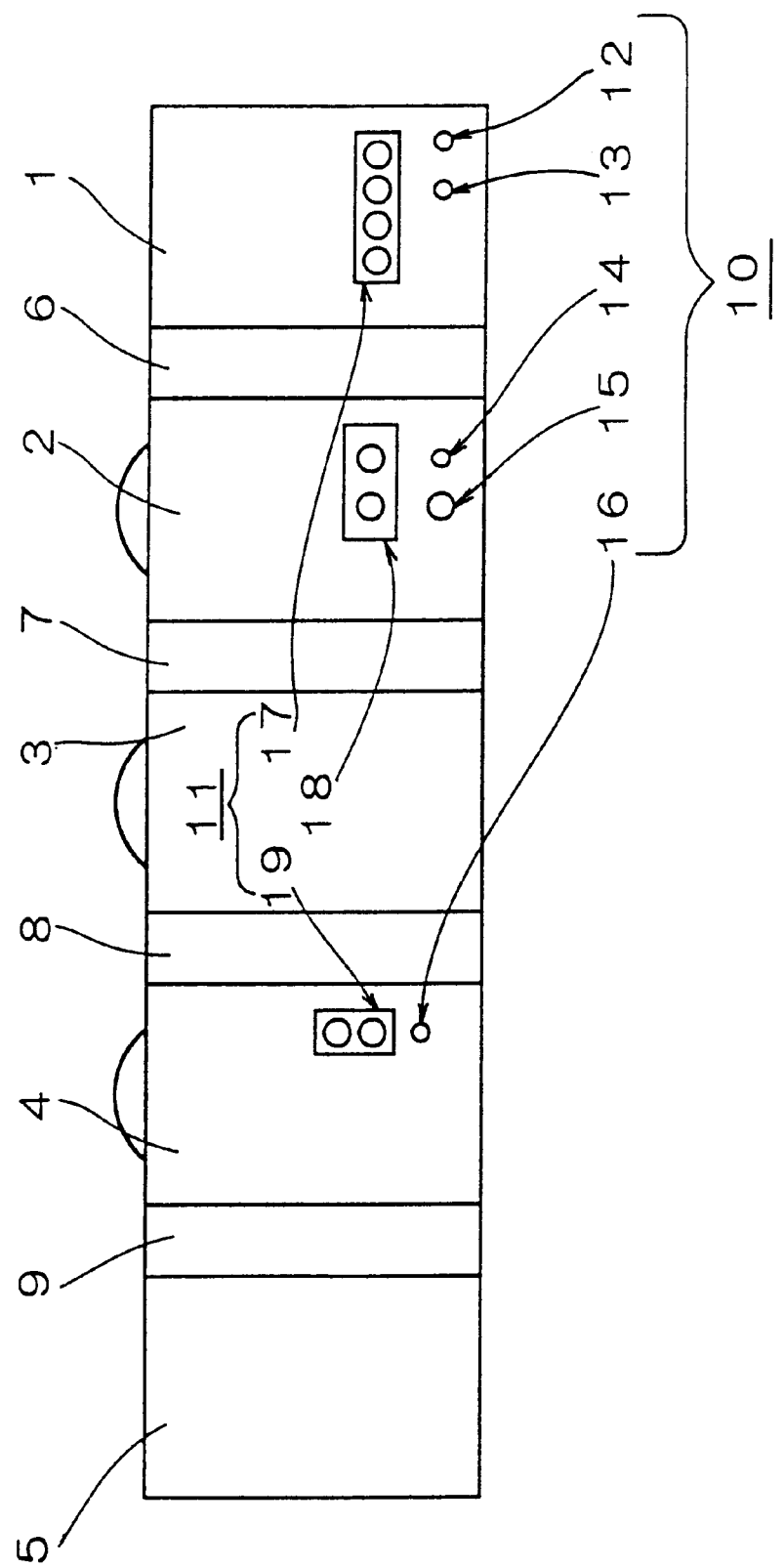
FIG. 14 is a side view illustrating the conventional apparatus as seen from an arrow A in FIG. 13.

FIGS. 11 and 12 are a plan view and a sectional view, respectively, which schematically illustrate the internal construction of a double-side brush unit UE which is to be used in place of the back-side brush unit U2. The double-side brush unit UE has substantially the same exterior construction as the back-side brush unit U1 shown in FIGS. 2A, 2B and 3. Therefore, the exterior construction of the unit UE is not illustrated, but a reference will be made to FIGS. 2A and 2B if necessary. In FIGS. 11 and 12, the same components as shown in FIGS. 3 and 4 are denoted by the same reference characters and will not particularly be explained.

The double-side brush unit UE includes a wafer retention device 150 having a pair of hands 151 and 152 disposed in an opposed relation. The pair of hands 151 and 152 each has three retention rollers 153 provided upright thereon in a rotatable manner. The retention rollers 153 each has a generally I-shape having a narrow portion in the middle thereof. The circumferential edge of the wafer W is held by the retention rollers 153 in abutment against the narrow portions thereof. The retention rollers 153 are each rotated in abutment against the edge of the wafer W. The retention hands 151 and 153 are movable toward and away from each other so as to be shifted between a state where the wafer W is held by the retention rollers 153 thereof and a state where the wafer W is released from the retention rollers 153.

The three retention rollers 153 of the retention hand 151, for example, are rotatively driven for rotation of the wafer W, and the three retention rollers 153 of the retention hand 152 are rotated by the rotation of the wafer W. Thus, the wafer W can horizontally be rotated about the vertical axis thereof. Since the wafer W can be rotated by rotatively driving at least one of the six retention rollers 153, the number of the retention rollers to be rotatively driven may be smaller than or greater than three. Where the six retention rollers 153 are all adapted to be rotatively driven, the wafer W can be rotated in the most stable manner.

An upper disk brush 161 and a lower disk brush 162 are respectively disposed above and below a wafer holding position where the wafer W is held by the wafer retention device 150. The upper disk brush 161 is adapted to be driven rotatively about a rotation shaft 163 and vertically moved. Similarly, the lower disk brush 162 is adapted to be driven rotatively about a rotation shaft 164 and vertically moved.

The upper disk brush 161 and the lower disk brush 162 are disposed in a completely overlapped relation as viewed in plan. The scrub-cleaning of the front and back sides of the wafer W is achieved by rotatively driving the upper and lower disk brushes 161 and 162 with the wafer W held therebetween. Since the wafer W is rotated by the rotation of the retention rollers 153, the entire surfaces of the wafer W can be subjected to the scrubbing.

For perfect cleaning of the front and back sides of the wafer W, the upper and lower disk brushes 161 and 162 each has a diameter greater than the radius of the wafer W and is disposed so as to cover portions of the wafer W extending from the center to the periphery thereof.

The rotation shafts 163 and 164 of the upper and lower disk brushes 161 and 162 are hollow shafts, through which the process liquid supply pipes 72 and 67 respectively extend. Nozzles 165 and 167 are provided at the distal ends of the process liquid supply pipes 72 ad 67, respectively. Therefore, the front and back sides of the wafer W are scrubbed while being supplied with the process liquid from the nozzles 165 and 167.

While the embodiment of the present invention has thus been described, the invention can be embodied in different ways. Although the embodiment described above is directed to an apparatus for performing the CMP process and the cleaning process on a wafer, the invention is applicable to any of various processes (e.g., a development process for developing a resist film on a substrate after light exposure, a coating process for coating a substrate with a resist, a heat-treatment process for heating or cooling a substrate, and the like) to be performed on any other types of substrates such as rectangular glass substrates for liquid crystal display devices.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims. This application claims priority benefits under 35 USC Section 119 on the basis of Japanese Patent Application No. 9-247217 filed in the Japanese Patent Office on Sep. 11, 1997, the disclosure thereof being incorporated herein by reference.

What is claimed is:

1. A substrate processing apparatus comprising a plurality of substrate processing units, the plurality of substrate processing units each comprising:

a substrate processing section for processing a substrate held therein while supplying a process fluid to the substrate;

an enclosure enclosing the substrate processing section, and having an opening, formed in a side wall thereof, through which the substrate is carried in and out of the substrate processing section;

a process fluid pipe through which the process fluid is supplied to the substrate held in the processing section; and a connector section, provided on a side wall of the enclosure opposite across the substrate processing section from the side wall formed with the opening, for connecting the process fluid pipe to an external process fluid source, wherein the plurality of substrate processing units are arranged with the openings thereof being oriented in substantially the same direction.

2. A substrate processing apparatus as set forth in claim 1, further comprising substrate transportation mechanism adapted to be moved to positions opposed to the openings of the respective substrate processing units, for transporting the substrate to the substrate processing sections of the respective substrate processing units.

3. A substrate processing apparatus as set forth in claim 2, wherein the substrate transportation mechanism is movable along a transportation path, and the plurality of substrate processing units are arranged with the openings thereof facing to the transportation path.

4. A substrate processing apparatus as set forth in claim 1, wherein the substrate processing units each further comprises a display section, provided on the side wall of the enclosure opposite across the substrate processing section from the side wall formed with the opening, for displaying conditions of the process fluid flowing through the process fluid pipe.

5. A substrate processing apparatus as set forth in claim 1, further comprising a process fluid cabinet, provided outside the substrate processing unit on a side opposite across the substrate processing section from the opening, which has a tank containing the process fluid.

6. A substrate processing apparatus as set forth in claim 1, further comprising a built-in section in which the plurality of substrate processing units are incorporated as required.

7. A substrate processing unit, comprising:

a substrate processing section for processing a substrate held therein, while supplying a process fluid to the substrate;

an enclosure enclosing the substrate processing section, and having an access opening formed in a first side wall thereof, through which the substrate is carried in and out of the substrate processing section;

a process fluid pipe through which the process fluid is supplied to the substrate held in the processing section;

a connector section provided on a second side wall of the enclosure, on the opposite side of the substrate procession section from the first side wall, for connecting the process fluid pipe to an external process fluid source; and a display section provided on the second side wall for displaying conditions of the process fluid flowing thought the process fluid pipe.

8. A substrate processing unit, comprising:

a substrate processing section for processing a substrate held therein, while supplying a process fluid to the substrate;

an enclosure enclosing the substrate processing section, and having an access opening formed in a first side wall thereof, through which the substrate is carried in and out of the substrate processing section;

a process fluid pipe through which the process fluid is supplied to the substrate held in the processing section; and a process fluid source comprised of a process fluid cabinet located outside the substrate processing unit on the side opposite from the first side wall, and including a process fluid tank which stores the process fluid; and a connector section provided on a second side wall of the enclosure on the opposite side of the substrate procession section from the first side wall, for connecting the process fluid pipe to the external process fluid source.

* * * * *